(12) United States Patent
Lee et al.

(10) Patent No.: US 8,368,185 B2
(45) Date of Patent: Feb. 5, 2013

(54) SEMICONDUCTOR DEVICE PACKAGES WITH ELECTROMAGNETIC INTERFERENCE SHIELDING

(75) Inventors: Yuyong Lee, Paju-Si (KR); Seokbong Kim, Paju-Si (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 404 days.

(21) Appl. No.: 12/622,419

(22) Filed: Nov. 19, 2009

(65) Prior Publication Data

US 2011/0115059 A1    May 19, 2011

(51) Int. Cl.
| | |
|---|---|
| H01L 23/552 | (2006.01) |
| H01L 39/00 | (2006.01) |
| H01L 23/58 | (2006.01) |
| H01L 23/62 | (2006.01) |
| H01L 23/48 | (2006.01) |

(52) U.S. Cl. ........ 257/659; 257/660; 257/664; 257/662; 257/688

(58) Field of Classification Search .................. 257/659, 257/662, 664, 508, 660, 690, 708, 688
See application file for complete search history.

(56) References Cited

U.S. PATENT DOCUMENTS

| | | |
|---|---|---|
| 3,390,226 A | 6/1968 | Beyerlein |
| 4,569,786 A | 2/1986 | Deguchi |
| 4,717,948 A | 1/1988 | Sakai et al. |
| 4,814,205 A | 3/1989 | Arcilesi et al. |
| 4,821,007 A | 4/1989 | Fields et al. |
| 5,140,745 A | 8/1992 | McKenzie |
| 5,166,772 A | 11/1992 | Soldner et al. |
| 5,172,077 A | 12/1992 | Funada |
| 5,353,498 A | 10/1994 | Fillion et al. |
| 5,355,016 A | 10/1994 | Swirbel et al. |
| 5,497,033 A | 3/1996 | Fillion et al. |
| 5,557,142 A | 9/1996 | Gilmore et al. |

(Continued)

FOREIGN PATENT DOCUMENTS

| | | |
|---|---|---|
| CN | 1442033 A | 9/2003 |
| CN | 1774804 A | 5/2006 |

(Continued)

OTHER PUBLICATIONS

Kim et al. "Semiconductor Device Packages With Electromagnetic Interference Shielding." U.S. Appl. No. 12/622,415, filed Nov. 19, 2009.

(Continued)

*Primary Examiner* — Chuong A. Luu
(74) *Attorney, Agent, or Firm* — Foley & Lardner LLP

(57) ABSTRACT

Described herein are semiconductor device packages with EMI shielding and related methods. In one embodiment, a semiconductor device package includes a circuit substrate, an electronic device, an encapsulant, and a conductive coating. The circuit substrate includes a carrying surface, a bottom surface, a lateral surface extending between the carrying surface and the bottom surface, a conductive layer, and a grounding ring. The grounding ring is in a substantially continuous pattern extending along a border of the circuit substrate, is exposed at a lateral surface of the circuit substrate, and is included in the conductive layer. The electronic device is disposed adjacent to the carrying surface and is electrically connected to the conductive layer of the circuit substrate. The encapsulant is disposed adjacent to the carrying surface and encapsulates the electronic device. The conductive coating is applied to the encapsulant and the grounding ring.

20 Claims, 11 Drawing Sheets

U.S. PATENT DOCUMENTS

| | | |
|---|---|---|
| 5,600,181 A | 2/1997 | Scott et al. |
| 5,639,989 A | 6/1997 | Higgins, III |
| 5,677,511 A | 10/1997 | Taylor et al. |
| 5,694,300 A | 12/1997 | Mattei et al. |
| 5,703,761 A | 12/1997 | Heiss |
| 5,726,612 A | 3/1998 | Mandai |
| 5,729,437 A | 3/1998 | Hashimoto |
| 5,776,798 A | 7/1998 | Quan et al. |
| 5,847,930 A | 12/1998 | Kazle |
| 5,864,088 A | 1/1999 | Sato et al. |
| 5,886,876 A | 3/1999 | Yamaguchi |
| 5,895,229 A | 4/1999 | Carney et al. |
| 5,898,344 A | 4/1999 | Hayashi |
| 5,966,052 A | 10/1999 | Sakai |
| 5,977,626 A | 11/1999 | Wang et al. |
| 5,998,867 A | 12/1999 | Jensen et al. |
| 6,079,099 A | 6/2000 | Uchida et al. |
| 6,093,972 A | 7/2000 | Carney et al. |
| 6,150,193 A * | 11/2000 | Glenn ............................ 438/113 |
| 6,194,250 B1 | 2/2001 | Melton et al. |
| 6,225,694 B1 | 5/2001 | Terui |
| 6,255,143 B1 | 7/2001 | Briar |
| 6,261,680 B1 | 7/2001 | Denman |
| 6,369,335 B1 | 4/2002 | Wajima |
| 6,376,769 B1 | 4/2002 | Chung |
| 6,448,632 B1 | 9/2002 | Takiar et al. |
| 6,455,864 B1 | 9/2002 | Featherby et al. |
| 6,472,598 B1 | 10/2002 | Glenn |
| 6,472,743 B2 | 10/2002 | Huang et al. |
| 6,479,903 B2 | 11/2002 | Briar |
| 6,492,194 B1 | 12/2002 | Bereau et al. |
| 6,521,978 B2 | 2/2003 | Fenk et al. |
| 6,566,596 B1 | 5/2003 | Askew |
| 6,586,822 B1 | 7/2003 | Vu et al. |
| 6,602,737 B2 | 8/2003 | Wu |
| 6,614,102 B1 | 9/2003 | Hoffman et al. |
| 6,635,953 B2 | 10/2003 | Wu |
| 6,686,649 B1 | 2/2004 | Mathews et al. |
| 6,695,985 B2 | 2/2004 | Igarashi et al. |
| 6,740,546 B2 | 5/2004 | Corisis et al. |
| 6,740,959 B2 | 5/2004 | Alcoe et al. |
| 6,757,181 B1 | 6/2004 | Villanueva |
| 6,781,231 B2 | 8/2004 | Minervini |
| 6,800,804 B2 | 10/2004 | Igarashi et al. |
| 6,838,776 B2 | 1/2005 | Leal et al. |
| 6,856,007 B2 | 2/2005 | Warner |
| 6,865,084 B2 | 3/2005 | Lin et al. |
| 6,867,480 B2 | 3/2005 | Legaspi, Jr. et al. |
| 6,881,896 B2 | 4/2005 | Ebihara |
| 6,900,383 B2 | 5/2005 | Babb et al. |
| 6,928,719 B2 | 8/2005 | Kim et al. |
| 6,962,869 B1 | 11/2005 | Bao et al. |
| 6,967,403 B2 | 11/2005 | Chuang et al. |
| 6,975,516 B2 | 12/2005 | Asahi et al. |
| 6,992,400 B2 | 1/2006 | Tikka et al. |
| 6,998,532 B2 | 2/2006 | Kawamoto et al. |
| 7,012,323 B2 | 3/2006 | Warner et al. |
| 7,030,469 B2 | 4/2006 | Mahadevan et al. |
| 7,045,385 B2 | 5/2006 | Kim et al. |
| 7,049,682 B1 | 5/2006 | Mathews et al. |
| 7,081,661 B2 | 7/2006 | Takehara et al. |
| 7,125,744 B2 | 10/2006 | Takehara et al. |
| 7,126,218 B1 | 10/2006 | Darveaux et al. |
| 7,161,252 B2 | 1/2007 | Tsuneoka et al. |
| 7,180,012 B2 | 2/2007 | Tsuneoka et al. |
| 7,183,498 B2 | 2/2007 | Ogura et al. |
| 7,186,928 B2 | 3/2007 | Kikuchi et al. |
| 7,187,060 B2 | 3/2007 | Usui |
| 7,294,587 B2 | 11/2007 | Asahi et al. |
| 7,327,015 B2 | 2/2008 | Yang et al. |
| 7,342,303 B1 | 3/2008 | Berry et al. |
| 7,372,151 B1 | 5/2008 | Fan et al. |
| 7,445,968 B2 | 11/2008 | Harrison et al. |
| 7,446,265 B2 | 11/2008 | Krohto et al. |
| 7,451,539 B2 | 11/2008 | Morris et al. |
| 7,478,474 B2 | 1/2009 | Koga |
| 7,488,903 B2 | 2/2009 | Kawagishi et al. |
| 7,566,955 B2 | 7/2009 | Warner |
| 7,576,415 B2 | 8/2009 | Cha et al. |
| 7,629,674 B1 | 12/2009 | Foster |
| 7,633,170 B2 | 12/2009 | Yang et al. |
| 7,633,765 B1 | 12/2009 | Scanlan et al. |
| 7,643,311 B2 | 1/2010 | Coffy |
| 7,656,047 B2 | 2/2010 | Yang et al. |
| 7,700,411 B2 | 4/2010 | Yang et al. |
| 7,741,151 B2 | 6/2010 | Amrine et al. |
| 7,745,910 B1 | 6/2010 | Olson et al. |
| 7,772,046 B2 | 8/2010 | Pagaila et al. |
| 7,799,602 B2 | 9/2010 | Pagaila et al. |
| 7,829,981 B2 | 11/2010 | Hsu |
| 7,989,928 B2 | 8/2011 | Liao et al. |
| 8,022,511 B2 | 9/2011 | Chiu et al. |
| 2002/0053724 A1 | 5/2002 | Lai et al. |
| 2002/0093108 A1 | 7/2002 | Grigorov |
| 2004/0020673 A1 | 2/2004 | Mazurkiewicz |
| 2004/0063242 A1 | 4/2004 | Karnezos |
| 2004/0150097 A1 | 8/2004 | Gaynes et al. |
| 2004/0178500 A1 | 9/2004 | Usui |
| 2004/0231872 A1 | 11/2004 | Arnold et al. |
| 2004/0252475 A1 | 12/2004 | Tsuneoka et al. |
| 2005/0013082 A1 | 1/2005 | Kawamoto et al. |
| 2005/0029673 A1 | 2/2005 | Naka et al. |
| 2005/0039946 A1 | 2/2005 | Nakao |
| 2005/0045358 A1 | 3/2005 | Arnold |
| 2005/0046001 A1 | 3/2005 | Warner |
| 2005/0208702 A1 | 9/2005 | Kim |
| 2006/0145361 A1 | 7/2006 | Yang et al. |
| 2006/0148317 A1 | 7/2006 | Akaike et al. |
| 2006/0160261 A1 | 7/2006 | Sheats et al. |
| 2006/0266547 A1 | 11/2006 | Koga |
| 2007/0241437 A1 | 10/2007 | Kagaya et al. |
| 2008/0042301 A1 | 2/2008 | Yang et al. |
| 2008/0061407 A1 | 3/2008 | Yang et al. |
| 2008/0128890 A1 | 6/2008 | Choi et al. |
| 2008/0174013 A1 | 7/2008 | Yang et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0025211 A1 | 1/2009 | Hiner et al. |
| 2009/0027863 A1 | 1/2009 | Karnezos |
| 2009/0035895 A1 | 2/2009 | Lee et al. |
| 2009/0075428 A1 | 3/2009 | Tang et al. |
| 2009/0102003 A1 | 4/2009 | Vogt et al. |
| 2009/0102033 A1 | 4/2009 | Raben |
| 2009/0152688 A1 | 6/2009 | Do et al. |
| 2009/0194851 A1 | 8/2009 | Chiu et al. |
| 2009/0194852 A1 | 8/2009 | Chiu et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chien et al. |
| 2009/0230526 A1 | 9/2009 | Chen et al. |
| 2009/0236700 A1 | 9/2009 | Moriya |
| 2009/0256244 A1 | 10/2009 | Liao et al. |
| 2009/0261470 A1 | 10/2009 | Choi et al. |
| 2009/0294928 A1 | 12/2009 | Kim et al. |
| 2009/0302435 A1 | 12/2009 | Pagaila et al. |
| 2009/0302446 A1 | 12/2009 | Lee et al. |
| 2010/0006330 A1 | 1/2010 | Fu et al. |
| 2010/0013064 A1 | 1/2010 | Hsu |
| 2010/0032815 A1 | 2/2010 | An et al. |
| 2010/0109132 A1* | 5/2010 | Ko et al. ....................... 257/660 |
| 2010/0110656 A1 | 5/2010 | Ko et al. |
| 2010/0140759 A1* | 6/2010 | Pagaila et al. ................. 257/660 |
| 2010/0207257 A1 | 8/2010 | Lee |
| 2010/0207258 A1 | 8/2010 | Eun et al. |
| 2010/0207259 A1 | 8/2010 | Liao et al. |
| 2011/0006408 A1 | 1/2011 | Liao |
| 2011/0115060 A1 | 5/2011 | Chiu et al. |
| 2011/0115066 A1 | 5/2011 | Kim |
| 2011/0127654 A1 | 6/2011 | Weng et al. |

FOREIGN PATENT DOCUMENTS

| | | |
|---|---|---|
| JP | 55044737 | 3/1980 |
| JP | 58122759 | 7/1983 |
| JP | 59051555 | 3/1984 |
| JP | 63262860 | 10/1988 |
| JP | 64037043 | 2/1989 |
| JP | 64064298 | 3/1989 |
| JP | 02078299 | 3/1990 |
| JP | 03023654 | 1/1991 |
| JP | 03171652 | 7/1991 |
| JP | 04147652 | 5/1992 |
| JP | 04206858 | 7/1992 |
| JP | 05129476 | 5/1993 |
| JP | 08-288686 | 1/1996 |
| JP | 2003273571 | 9/2003 |
| WO | 2004/060034 A1 | 7/2004 |
| WO | WO 2006076613 | 7/2006 |

OTHER PUBLICATIONS

Weng et al., "Semiconductor Package and Manufacturing Methods Thereof." U.S. Appl. No. 12/955,782, filed Nov. 29, 2009.

Liao et al. "Semiconductor Device Packages With Electromagnetic Interference Shielding" U.S. Appl. No. 12/770,645, filed Apr. 20, 2010.

Chiu et al. "Wafer-Level Semiconductor Device Packages With Electromagnetic Interference Shielding." U.S. Appl. No. 12/622,393, filed Nov. 19, 2009.

Paju-Si et al., "Semiconductor Device Packages with Electromagnetic Interference Shielding," U.S. Appl. No. 12/432,621, filed Apr. 29, 2009, 35 pages.

\* cited by examiner

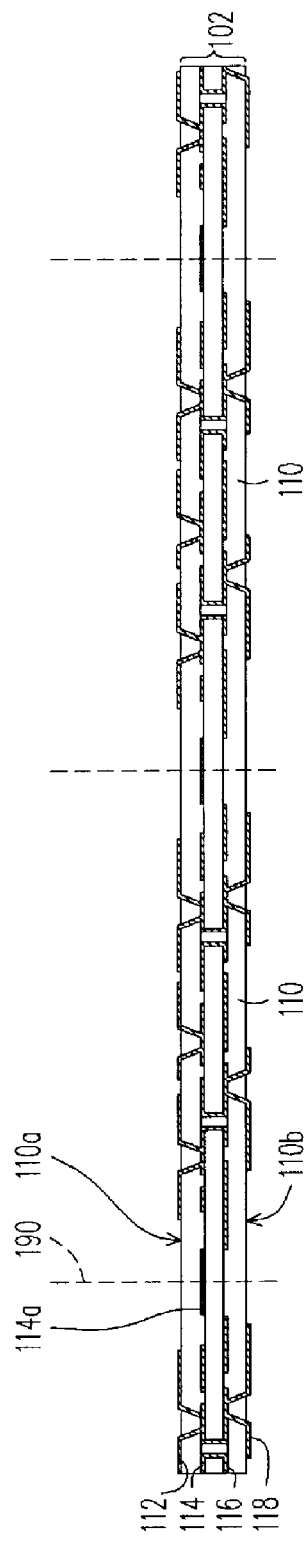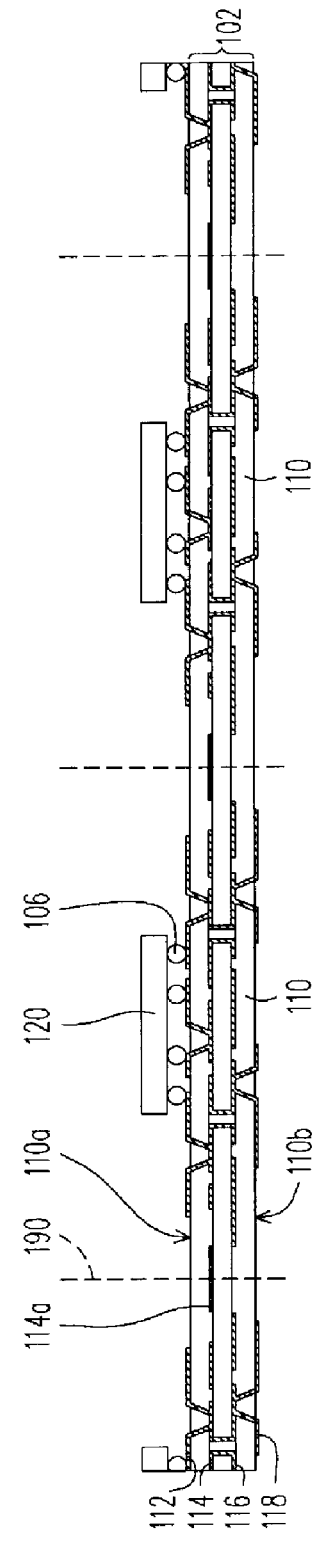

SEMICONDUCTOR DEVICE PACKAGES WITH ELECTROMAGNETIC INTERFERENCE SHIELDING

FIELD OF THE INVENTION

The present invention generally relates to semiconductor device packages. More particularly, the invention relates to semiconductor device packages with electromagnetic interference shielding.

BACKGROUND

Semiconductor devices have become progressively more complex, driven at least in part by the demand for enhanced processing speeds and smaller sizes. While the benefits of enhanced processing speeds and smaller sizes are apparent, these characteristics of semiconductor devices also can create problems. In particular, higher clock speeds can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of that semiconductor device. This phenomenon is sometimes referred to as electromagnetic interference ("EMI"). Smaller sizes of semiconductor devices can exacerbate EMI by providing a higher density of those semiconductor devices within an overall electronic system, and, thus, a higher level of undesired electromagnetic emissions at a neighboring semiconductor device.

One way to reduce EMI is to shield a set of semiconductor devices within a semiconductor device package. In particular, shielding can be accomplished by including an electrically conductive casing or housing that is electrically grounded and is secured to an exterior of the package. When electromagnetic emissions from an interior of the package strike an inner surface of the casing, at least a portion of these emissions can be electrically shorted, thereby reducing the level of emissions that can pass through the casing and adversely affect neighboring semiconductor devices. Similarly, when electromagnetic emissions from a neighboring semiconductor device strike an outer surface of the casing, a similar electrical shorting can occur to reduce EMI of semiconductor devices within the package.

While an electrically conductive casing can reduce EMI, the use of the casing can suffer from a number of disadvantages. In particular, the casing is typically secured to an exterior of a semiconductor device package by an adhesive. Unfortunately, the casing can be prone to peeling or falling off, since binding characteristics of the adhesive can be adversely affected by temperature, humidity, and other environmental conditions. Also, when securing the casing to the package, the size and shape of the casing and the size and shape of the package should match within relatively small tolerance levels. This matching of sizes and shapes and associated precision in relative positioning of the casing and the package can render manufacturing operations costly and time consuming. Because of this matching of sizes and shapes, it also follows that semiconductor device packages of different sizes and shapes can require different casings, which can further increase manufacturing cost and time to accommodate the different packages.

It is against this background that a need arose to develop the semiconductor device packages and related methods described herein.

SUMMARY

Accordingly, one aspect of the present invention is directed to a semiconductor device package with electromagnetic interference shielding.

In one embodiment, a semiconductor device package includes a circuit substrate, an electronic device, an encapsulant, and a conductive coating. The circuit substrate includes a carrying surface, a bottom surface, a lateral surface extending between the carrying surface and the bottom surface, a conductive layer, and a grounding ring. The grounding ring is in a substantially continuous pattern extending along a border of the circuit substrate, is exposed at a lateral surface of the circuit substrate, and is included in the conductive layer. The electronic device is disposed adjacent to the carrying surface and is electrically connected to the conductive layer of the circuit substrate. The encapsulant is disposed adjacent to the carrying surface and encapsulates the electronic device. The conductive coating is applied to the encapsulant and the grounding ring.

In addition, a peripheral portion of the carrying surface may be downwardly recessed to form a recessed portion, the recessed portion extending along the border of the circuit substrate and included in the lateral surface of the circuit substrate. The grounding ring may be exposed at the recessed portion.

In addition, the circuit substrate may be a multilayer circuit substrate, the recessed portion may be downwardly recessed to an inner layer of the circuit substrate, and the conductive layer may be located above the inner layer.

In addition, a bottom of the recessed portion may be curved. The grounding ring may be exposed at the curved bottom of the recessed portion.

In addition, a portion of the grounding ring exposed at the lateral surface may extend fully around the border of the circuit substrate. The conductive coating may be applied to substantially all of the portion of the grounding ring exposed at the lateral surface.

In another embodiment, a semiconductor device package includes a circuit substrate, an electronic device, an encapsulant, and an electromagnetic interference shield. The circuit substrate includes a first surface, a second opposing surface, and a first grounding ring. The first grounding ring includes a first exposed connection surface that is disposed between the first surface and the second opposing surface of the circuit substrate, and that extends at least fifty percent around the circuit substrate in a first plane substantially parallel to the first surface and the second opposing surface. The electronic device is disposed adjacent to the first surface and is electrically connected to the circuit substrate. The encapsulant is disposed adjacent to the first surface and encapsulates the electronic device. The electromagnetic interference shield is disposed adjacent to the encapsulant and the first exposed connection surface of the first grounding ring.

In addition, the electromagnetic interference shield may include a conformal coating applied to substantially all of the first exposed connection surface of the first grounding ring. The first exposed connection surface of the first grounding ring may extend fully around the circuit substrate in the first plane.

In addition, the electromagnetic interference shield may include a conformal coating that includes at least one of aluminum, copper, chromium, gold, silver, nickel, tin, and stainless steel.

In addition, the circuit substrate may include a second grounding ring including a second exposed connection surface, the second exposed connection surface disposed between the first surface and the second opposing surface of the circuit substrate, and extending at least fifty percent around the circuit substrate in a second plane substantially parallel to the first plane. The electromagnetic interference shield may be applied to substantially all of the second exposed connection surface of the second grounding ring.

Another aspect of the present invention is further directed to methods of forming a semiconductor device package with electromagnetic interference shielding. In one embodiment, a method of forming a semiconductor device package includes: (1) providing a substrate including a carrying surface, a bottom surface, and a grounding ring; (2) electrically connecting a semiconductor device to the carrying surface of the substrate; (3) applying a molding material to the carrying surface of the substrate to form a molded structure covering the semiconductor device; (4) forming a first set of cutting slits extending through the molded structure and extending partially through the substrate, such that: (a) a portion of the molded structure covers the semiconductor device; (b) a portion of a lateral surface of the substrate is exposed; and (c) a portion of the grounding ring is exposed in a substantially continuous pattern at the lateral surface; (5) forming a conductive coating adjacent to the portion of the molded structure covering the semiconductor device, the portion of the lateral surface exposed by the first set of cutting slits, and the portion of the grounding ring exposed by the first set of cutting slits; and (6) forming a second set of cutting slits extending through the conductive coating and the substrate, such that: (a) the conductive coating is sub-divided to form an electromagnetic interference shield disposed adjacent to the semiconductor device, the portion of the lateral surface exposed by the first set of cutting slits, and the portion of the grounding ring exposed by the first set of cutting slits; (b) the substrate is sub-divided to form a substrate unit including a carrying surface, the semiconductor device disposed adjacent to the carrying surface of the substrate unit; and (c) the substrate unit includes the grounding ring, wherein the grounding ring is in a substantially continuous pattern extending along a border of the substrate unit.

In addition, a width of at least one of the first set of cutting slits may be in the range of 300 microns to 500 microns.

In addition, a width of at least one of the second set of cutting slits may be in the range of 250 microns to 350 microns.

In addition, the second set of cutting slits may be aligned with respect to the first set of cutting slits, and a width of at least one of the second set of cutting slits may be less than a width of at least one of the first set of cutting slits.

In addition, at least one of the first set of cutting slits may be curved.

BRIEF DESCRIPTION OF THE DRAWINGS

The accompanying drawings are included to provide a further understanding of some embodiments of the invention, and are incorporated in and constitute a part of this specification. The drawings illustrate embodiments of the invention and, together with the description, serve to explain the principles of some embodiments of the invention.

FIGS. 1A through 1F are schematic views showing a method of forming a semiconductor device package according to an embodiment of the present invention.

DETAILED DESCRIPTION

Figure 1C:
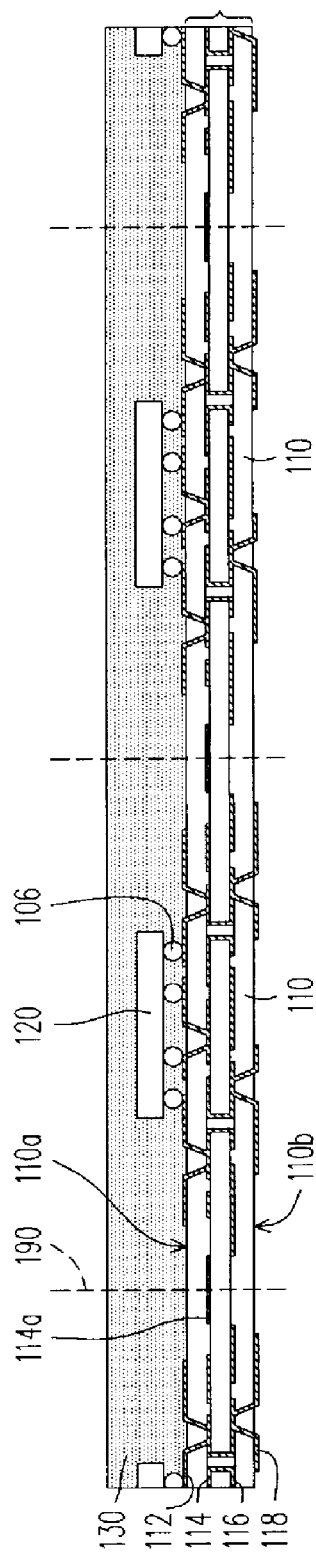

Reference will now be made in detail to some embodiments of the invention, examples of which are illustrated in the accompanying drawings. Wherever possible, the same reference numbers are used in the drawings and the description to refer to the same or like parts.

DEFINITIONS

The following definitions apply to some of the aspects described with respect to some embodiments of the invention. These definitions may likewise be expanded upon herein.

As used herein, the singular terms "a", "an" and "the" include plural referents unless the context clearly dictates otherwise. Thus, for example, reference to a grounding element can include multiple grounding elements unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, terms such as "inner," "top," "bottom," "above," "below," "downwardly," and "lateral" refer to a relative orientation of a set of components, such as in accordance with the drawings, but do not require a particular orientation of those components during manufacturing or use.

As used herein, the terms "connect", "connected" and "connection" refer to an operational coupling or linking. Connected components can be directly coupled to one another or can be indirectly coupled to one another, such as via another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "conductive" refers to an ability to transport an electric current. Electrically conductive materials typically correspond to those materials that exhibit little or no opposition to flow of an electric current. One measure of electrical conductivity is in terms of Siemens per meter ("$S \cdot m^{-1}$"). Typically, an electrically conductive material is one having a conductivity greater than about $10^4$ $S \cdot m^{-1}$, such as at least about $10^5$ $S \cdot m^{-1}$ or at least about $10^6$ $S \cdot m^{-1}$. Electrical conductivity of a material can sometimes vary with temperature. Unless otherwise specified, electrical conductivity of a material is defined at room temperature.

Aspects of the present invention can be used for fabricating various package structures, such as stacked type packages, multiple-chip packages, or high frequency device packages.

FIGS. 1A through 1F are schematic views showing a method of forming a semiconductor device package according to an embodiment of the present invention.

Referring to FIG. 1A, a circuit substrate strip 102 having a plurality of circuit substrates 110 (or substrate units 110) defined by the subsequent sawing lines 190 shown as dotted lines is provided, where each circuit substrate 110 has a carrying surface 110a and a bottom surface 110b. The circuit substrate strip 102 can be a laminated substrate, for example, a two-layered or a four-layered laminated substrate, etc., while the four-layered laminated substrate is taken as an example in this embodiment. Each circuit substrate 110 also has a lateral surface extending between the carrying surface 110a and the bottom surface 110b, as shown in FIG. 1D (described below). Each circuit substrate 110 has four conductive layers including a top conductive layer 112, a first inner conductive layer 114, a second inner conductive layer 116 and a bottom conductive layer 118. The conductive layers 112, 114, 116, and 118 are patterned and may be electrically connected to one another.

Figure 1D:
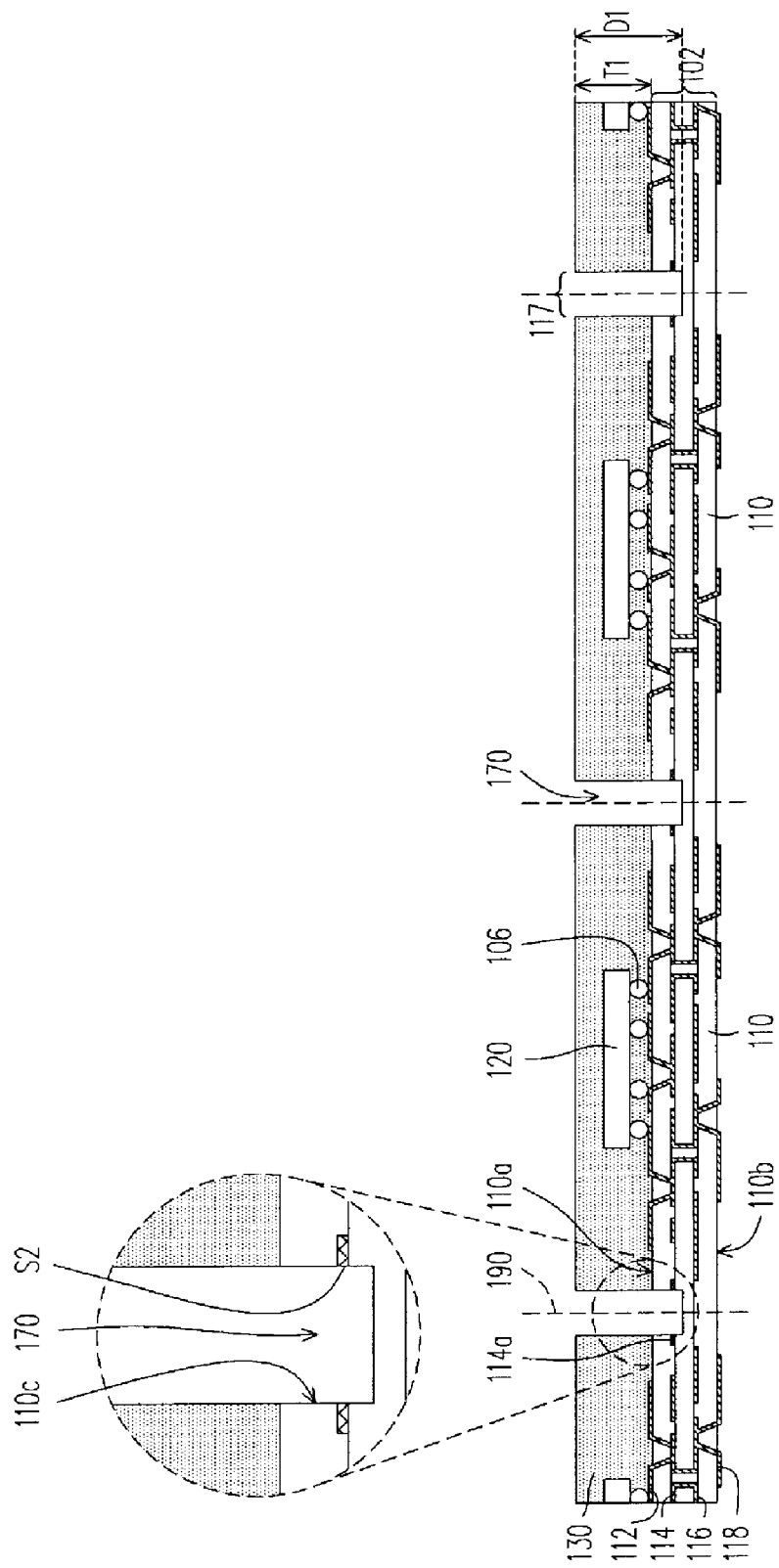
Figure 1E:
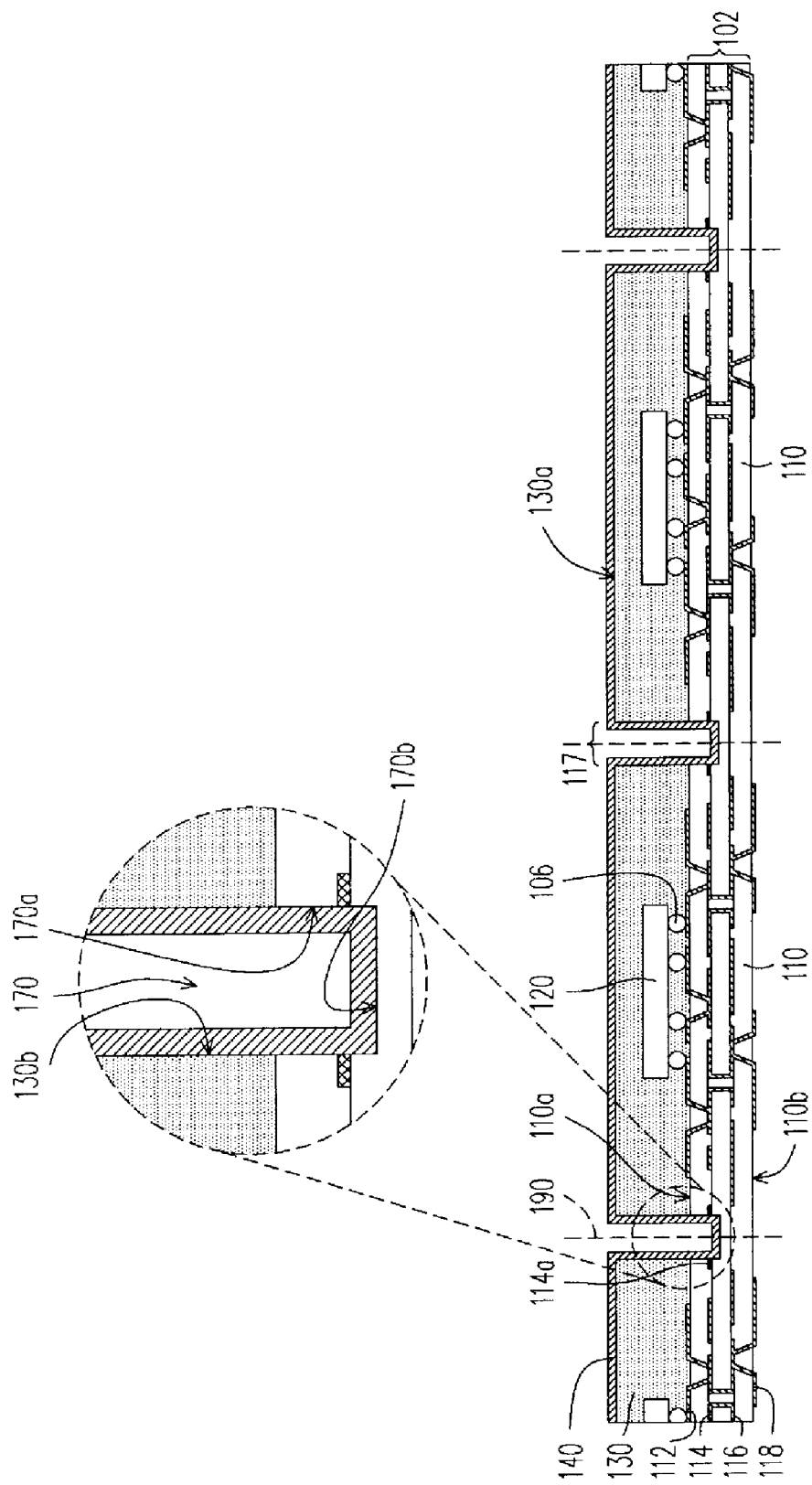
Figure 1F:
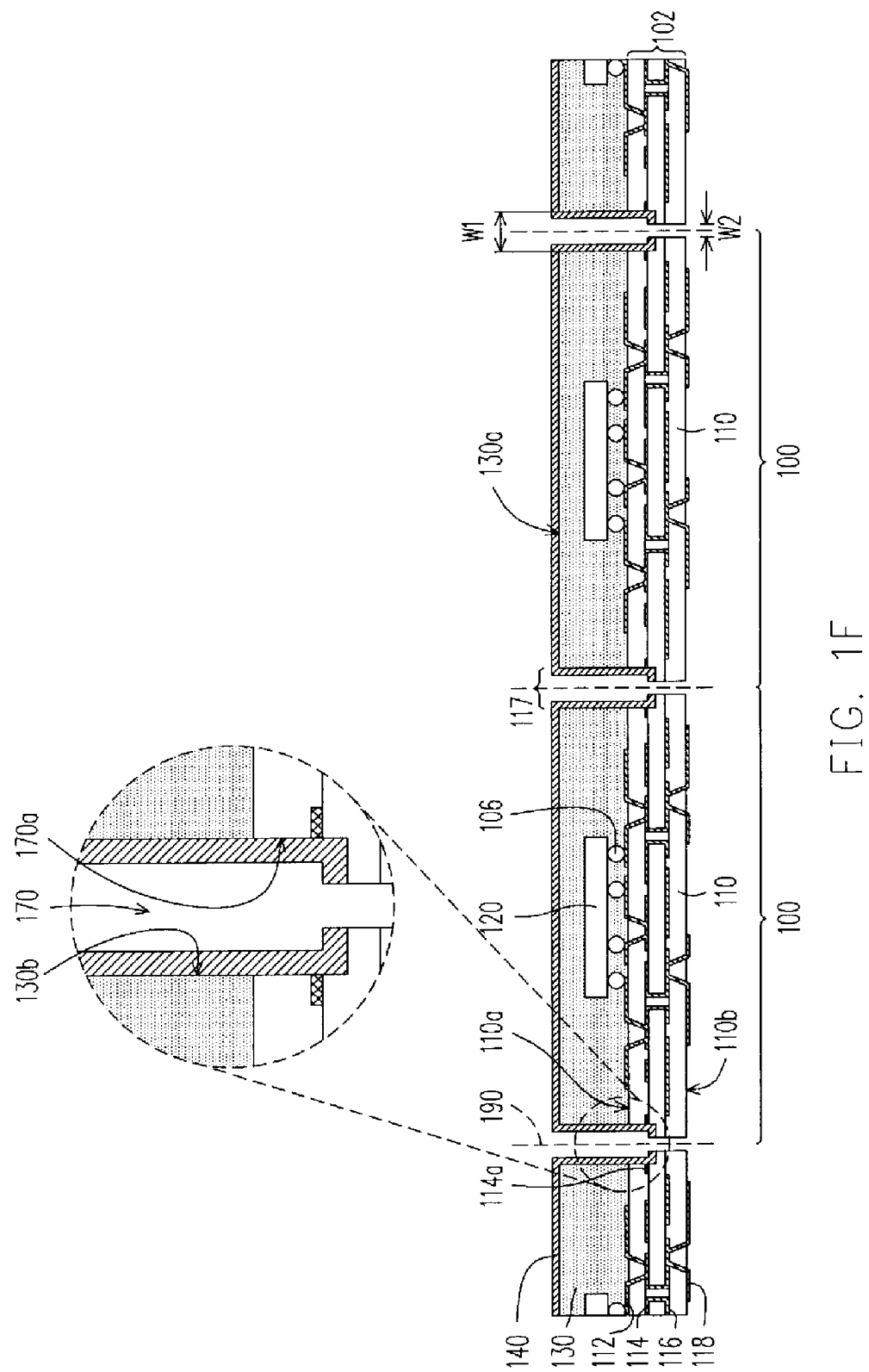
Figure 2:
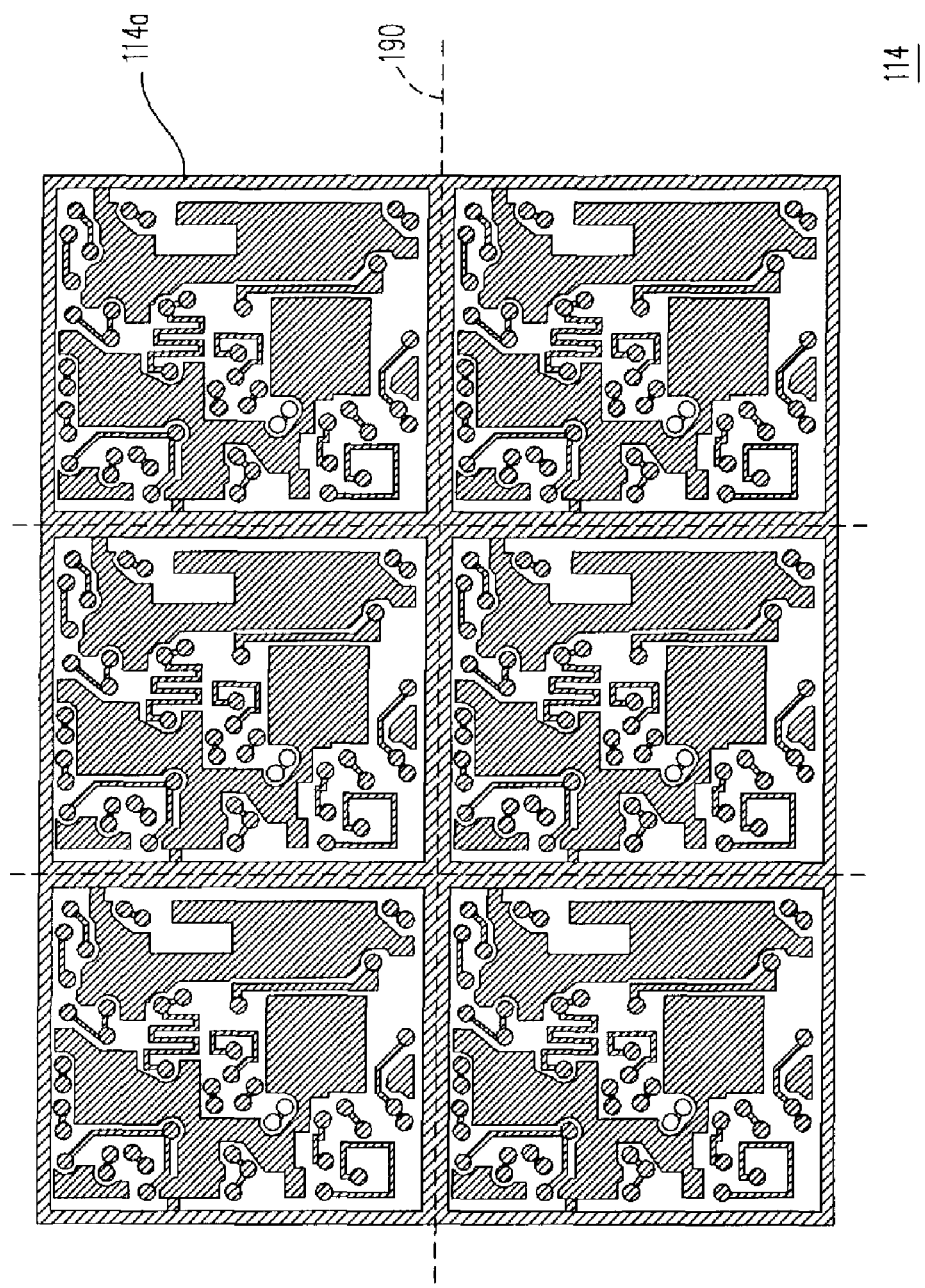
FIG. 2 is a top view showing the pattern of the first inner conductive layer of the circuit substrate strip of FIG. 1.

FIG. 2 is a top view showing the pattern of the first inner conductive layer 114 of the circuit substrate strip 102 of FIG. 1. With respect to each circuit substrate 110, the first inner conductive layer 114 has a grounding ring 114a. In one embodiment, the grounding ring 114a may be in a substantially continuous pattern extending along a border of the circuit substrate 110. Alternatively, the grounding ring may not be continuous. For example, the grounding ring may include a single grounding strip or multiple, disconnected grounding strips that each or collectively extend at least about fifty percent around the circuit substrate 110 in a first plane substantially parallel to the carrying surface 110a and the bottom surface 110b, such as at least about 60 percent or at least about 70 percent, and up to about 100 percent. While in the form of the circuit substrate strip 102, adjacent grounding rings 114a may be integrated with each other and may thereby form a frame extending along the sawing lines 190. Moreover, embodiments of the present invention provide no limitation as to the position or quantity of the grounding ring. In other embodiments, the grounding ring can be arranged in any of the top conductive layer, the inner conductive layer, and the bottom conductive layer.

Referring to FIG. 1B, electronic devices 120 (or semiconductor devices 120) are disposed on the carrying surface 110a and electrically connected to the circuit substrate 110 through a plurality of bumps 106 there-between. Herein, the electronic devices 120 may be chips. Each electronic device 120 preferably is disposed within a central portion of the corresponding circuit substrate 110. Although flip chip bonding technology is described herein, it is well encompassed within the scope of this invention to employ wire-bonding or other applicable bonding techniques, respectively.

Referring to FIG. 1C, a molding process is carried out to form an encapsulant 130 (or a molded structure 130) on the circuit substrate strip 102 to encapsulate the chips 120, the bumps 106 and at least a portion of each substrate 110. The molding process can be an over-molding process, for example. The material of the encapsulant 130 may be epoxy resins or silicon resins, for example.

Figure 3:
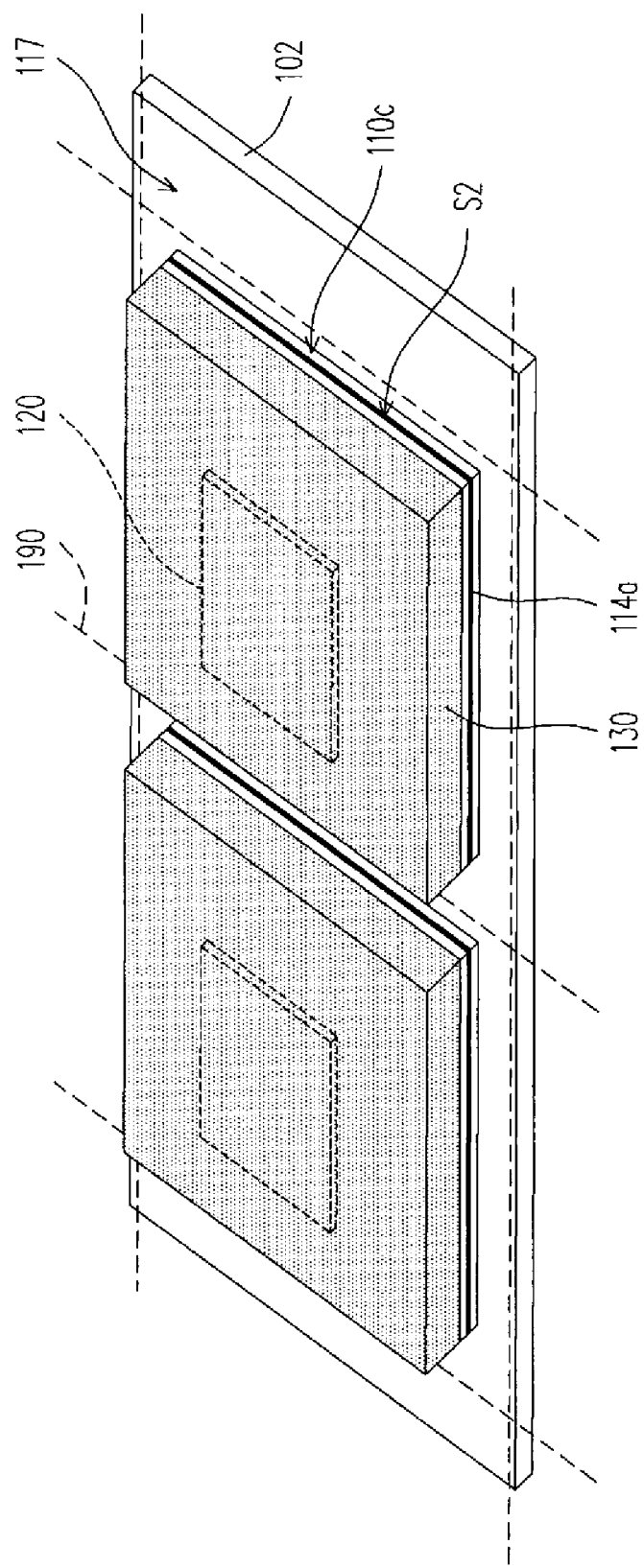
FIG. 3 shows a perspective view of the structure of FIG. 1D.

Referring to FIG. 1D and FIG. 3, where FIG. 3 further shows a perspective view of the structure of FIG. 1D, a half-cutting process is performed on the encapsulant 130 along the border of each circuit substrate 110, i.e. along the sawing lines 190, to remove a part of the encapsulant 130 and the circuit substrate strip 102. Specifically, the half-cutting process is performed by a cutting tool (not shown) with a depth D1 greater than the thickness T1 of the encapsulant, so as to fully cut through the encapsulant 130 and then partially cut into a peripheral portion 117 of each circuit substrate 110. Thus, an opening 170 (or a first set 170 of cutting slits) for exposing a sidewall S2 (or a connection surface S2) of the grounding ring 114a on the border of each circuit substrate 110 is thereby formed, i.e. the grounding ring 114a is exposed at the lateral surface 110c of each circuit substrate 110 in the recessed portion 117. In this embodiment, the lateral surface 110c may include both the substantially vertical and substantially horizontal surfaces of the circuit substrate 110 in the recessed portion 117. The lateral surface of a circuit substrate 110 may include both the lateral surface 110c in the recessed portion 117, and a lateral surface of the circuit substrate 110 defined by and extending along the sawing line 190.

Referring to FIG. 1E, after the half-cutting process, a conductive coating 140 may be formed to conformally cover the encapsulant 130 and the circuit substrate strip 102. The conductive coating 140 may be an electromagnetic interference shield that is directly applied on the encapsulant and the circuit substrate without using an extra metal casing, thereby reducing the manufacturing cost and time. Specifically, the conductive coating 140 conformally covers the top surface 130a of the encapsulant 130, the sidewalls 130b of the encapsulant 130, the sidewall 170a of each opening 170 and the bottom surface 170b of each opening 170. The sidewall S2 of each grounding ring 114a exposed by the opening 170 may be in contact with the conductive coating 140. The conductive coating 140 can be formed by spray coating, plating, or sputtering, for example. The metal material can be, for example, aluminum, copper, chromium, gold, silver, nickel, tin, stainless steel, solder material, or combinations thereof. A preferred thickness of the conductive coating 140 is between 1 μm and 20 μm.

In an alternative embodiment, an electromagnetic interference shield that is a pre-formed casing may be disposed adjacent to the encapsulant 130 and the circuit substrate strip 102.

Referring to FIG. 1F, a singulation process is performed by full-cutting the peripheral portion 117 along the border of each circuit substrate 110 (i.e. the subsequent sawing lines 190, or a second set 190 of cutting slits, shown as dotted lines) to separate the circuit substrates 110, so as to obtain plural individual package structures 100. The full-cutting process may be a blade sawing process or a laser cutting process, for example.

Since the half-cutting process is performed on the circuit substrate strip 102 to expose the grounding ring 114a at the lateral surface 110c of each circuit substrate 110, the subsequent conductive coating 140 is grounded via the grounding ring 114a by contacting the sidewall S2 thereof. Owing to the grounding ring 114a extending along the border of the circuit substrate 110, four sides of the circuit substrate 110 are capable of establishing grounding connections to provide a large contact area for the conductive coating 140. The reliability of the package structure and the EMI shielding efficacy can thereby be improved, and the sawing tolerance window can also thereby be enlarged.

In general, the width or the depth of the cutting path of the aforementioned half-cutting process or the aforementioned full-cutting process can be altered depending on the shielding requisites or other electrical properties of the package or even varied in accordance with the processing parameters. Preferably, referring to FIG. 1F, a width W1 of the cutting path of the half-cutting process is between 300 μm and 500 μm, and a width W2 of the cutting path of the full-cutting is between 250 μm and 350 μm.

Figure 4:
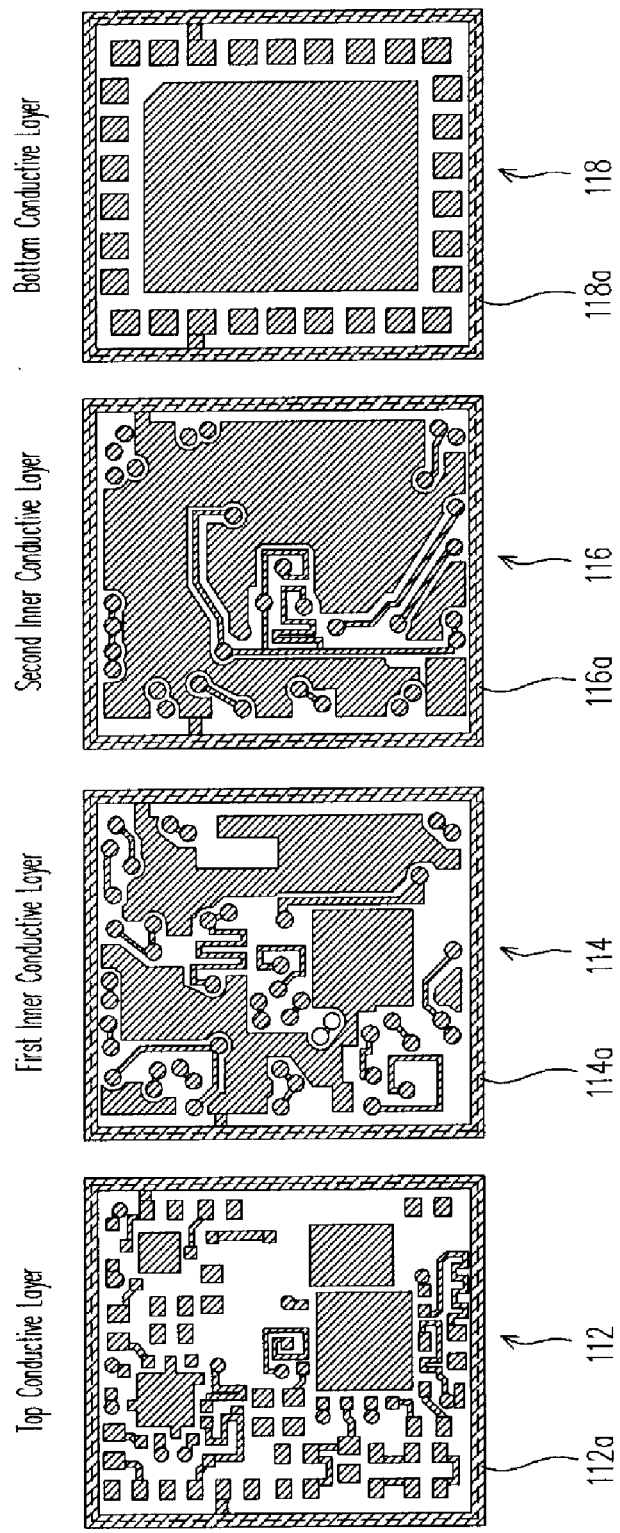
FIG. 4 shows the pattern of each conductive layer of a four-layered circuit substrate according to an embodiment of the present invention.

In accordance with some embodiments of the present invention, the cutting depth of the half-cutting process may be further modified according to the arrangement of the grounding ring, and thereby the depth of the peripheral portion of the circuit substrate can be varied. FIG. 4 further shows the pattern of each conductive layer of a four-layered circuit substrate according to an embodiment of the present invention. As shown in FIG. 4, the top conductive layer 112 is provided with a grounding ring 112a, the first inner conductive layer 114 is provided with a grounding ring 114a, the second inner conductive layer 116 is provided with a grounding ring 116a, and the bottom conductive layer 118 is provided with a grounding ring 118a. However, the arrangement of the grounding ring in any conductive layer of the circuit substrate is optional, and the combinations thereof are encompassed in the present invention. Several embodiments illustrating different package structures of the present invention are described in the following.

Figure 5:
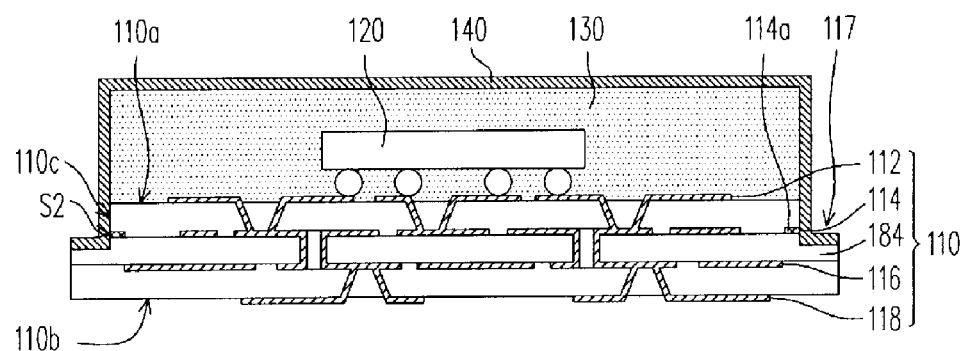
FIG. 5 is a cross-sectional view of a semiconductor device package structure according to an embodiment of the present invention.

Following the process steps of FIGS. 1A-1F, as shown in FIG. 5, the semiconductor device package 500 is obtained. The package structure 500 comprises the circuit substrate 110, the electronic device 120, the encapsulant 130, and the conductive coating 140. The electronic device 120 is disposed on the carrying surface 110a and is electrically connected to the circuit substrate 110. The encapsulant 130 is disposed on the carrying surface 110a and encapsulates the electronic device 120 thereon. A recessed portion 117 (i.e. the peripheral portion) extending along the border of the circuit substrate 110 and extending downwardly to a second dielectric layer 184 is formed by half-cutting to expose the grounding ring 114a of the first inner conductive layer 114 at the lateral surface 110c of the circuit substrate 110. The conductive coating 140 is applied to the encapsulant 130 and the sidewall S2 of the grounding ring 114a exposed by the lateral surface 110c of the circuit substrate 110. In this embodiment, the top conductive layer 112 above the first inner conductive layer 114 of the circuit substrate 110 may have no grounding ring, while the second inner conductive layer 116 or the bottom conductive layer 118 below the first inner conductive layer 114 may have a grounding ring 116a or 118a (as shown in FIG. 4) or not. Although the recessed portion 117 is not downwardly recessed to the second inner conductive layer 116 or the bottom conductive layer 118, the grounding ring 116a or 118a thereof can still be electrically connected with the grounding ring 114a and the conductive coating 140 through grounding vias in the circuit substrate 110.

Being encompassed within the scope of the present invention, the aforementioned recessed portion can be downwardly recessed to any inner layer of the circuit substrate to expose the grounding ring of the conductive layer located above the inner layer. The inner layer may be a dielectric layer or another conductive layer.

Figure 6:
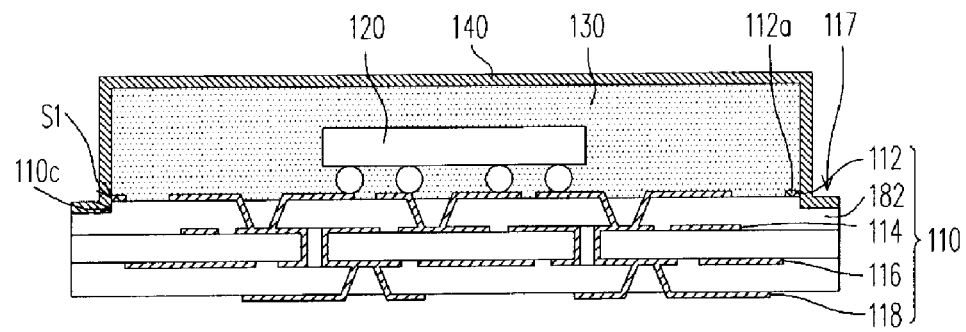
FIG. 6 is a cross-sectional view of a semiconductor device package structure according to another embodiment of the present invention.

FIG. 6 is a cross-sectional view of a semiconductor device package structure according to another embodiment of the present invention. Referring to FIG. 6, the package structure 600 is mostly similar to the package structure 500 of FIG. 5, except that the top conductive layer 112 has a grounding ring 112a as shown in FIG. 4, and the recessed portion 117 is downwardly recessed to a first dielectric layer 182 of the circuit substrate 110. The conductive coating 140 is applied to the encapsulant 130 and the sidewall S1 (or the connection surface S1) of the grounding ring 112a exposed at the lateral surface 110c of the circuit substrate 110. The first inner conductive layer 114, the second inner conductive layer 116, and the bottom conductive layer 118 below the top conductive layer 112 may or may not include the grounding rings 114a, 116a and 118a, respectively, as shown in FIG. 4.

Figure 7:
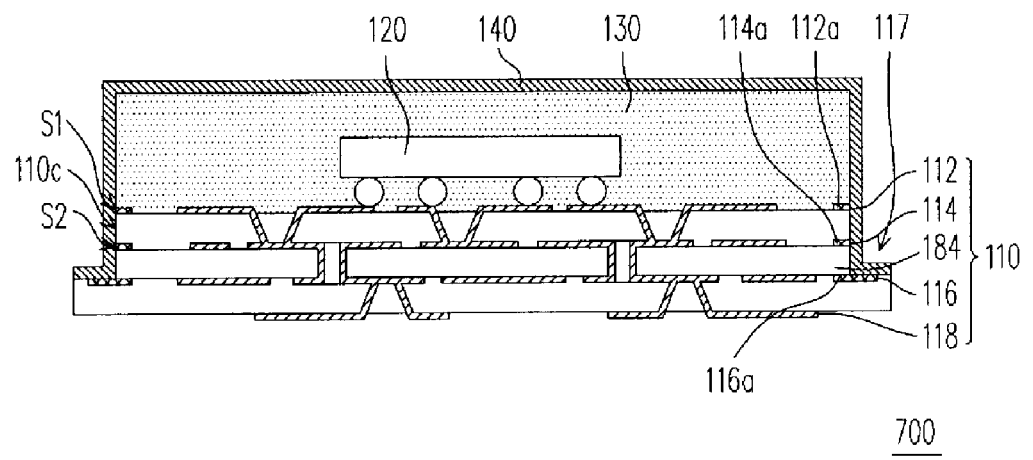
FIG. 7 is a cross-sectional view of a semiconductor device package structure according to another embodiment of the present invention.

FIG. 7 is a cross-sectional view of a semiconductor device package structure according to another embodiment of the present invention. Referring to FIG. 7, the package structure 700 is mostly similar to the package structure 500 of FIG. 5, except that both of the top conductive layer 112 and the first inner conductive layer 114 have grounding rings 112a and 114a, respectively, as shown in FIG. 4. The recessed portion 117 is downwardly recessed to the second dielectric layer 184 of the circuit substrate 110 and may expose the grounding ring 116a of the second inner conductive layer 116. The conductive coating 140 is applied to the encapsulant 130, and at the sidewall S1 of the grounding ring 112a and the sidewall S2 of the grounding ring 114a exposed at the lateral surface 110c of the circuit substrate 110. In other words, both of the grounding rings 112a and 114a above the second dielectric layer 184 are connected to the conductive coating 140 via the sidewalls S1 and S2 thereof. Moreover, the conductive coating 140 may be further applied to the grounding ring 116a exposed by the recessed portion 117. The bottom conductive layer 118 below the second inner conductive layer 116 may or may not have the grounding ring 118a as shown in FIG. 4.

Figure 8:
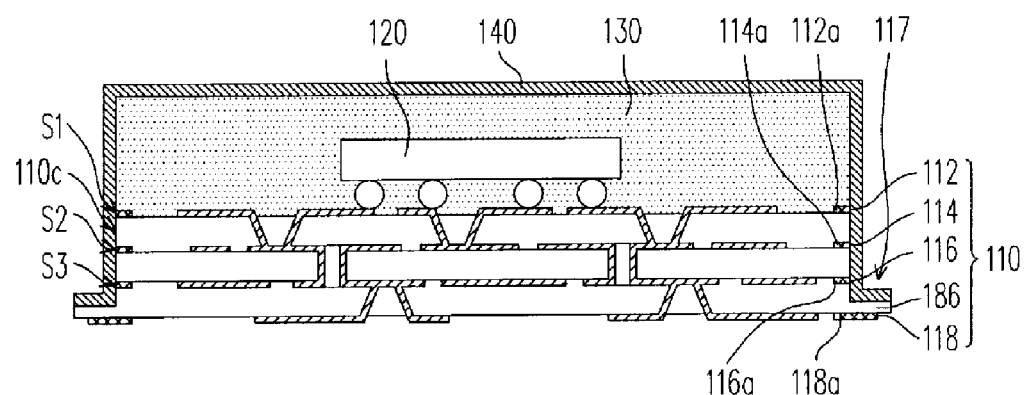
FIG. 8 is a cross-sectional view of a semiconductor device package structure according to another embodiment of the present invention.

FIG. 8 is a cross-sectional view of a semiconductor device package structure according to another embodiment of the present invention. Referring to FIG. 8, the package structure 800 is mostly similar to the package structure 500 of FIG. 5, except that all of the top conductive layer 112, the first inner conductive layer 114, the second inner conductive layer 116 and the bottom conductive layer 118 have grounding rings 112a, 114a, 116a and 118a, respectively, as shown in FIG. 4. The recessed portion 117 is downwardly recessed to a third dielectric layer 186 of the circuit substrate 110 and may or may not expose the grounding ring 118a of the bottom conductive layer 118. The conductive coating 140 is applied to the encapsulant 130, and to the sidewall S1 of the grounding ring 112a, the sidewall S2 of the grounding ring 114a, and the sidewall S3 (or the connection surface S3) of the grounding ring 116a exposed at the lateral surface 110c of the circuit substrate 110. In other words, the grounding rings 112a, 114a and 116a above the third dielectric layer 186 are all connected to the conductive coating 140 via the sidewalls S1, S2 and S3 thereof. Moreover, the conductive coating 140 may be further applied to the grounding ring 118a exposed by the recessed portion 117.

Hence, the conductive coating can be electrically connected to the ground plane or other reference plane of the circuit substrate by contacting the sidewall of the grounding ring configured in the circuit substrate. For example, an electrical ground path is established within the package structure for EMI shielding, devoid of using an extra ground plane. In addition, since the profile of the grounding ring is configured to extend along the border of the circuit substrate, a large contact area for the conductive coating is obtained. The reliability of the package structure and the EMI shielding efficacy can thereby be improved, and the sawing tolerance window can also thereby be enlarged.

Besides, embodiments of the present invention provide no limitation on the profile of the recessed portion, which may depend on the shape of the cutting tool, the shielding requisites or other electrical properties of the package, or even variations in the processing parameters.

Figure 9:
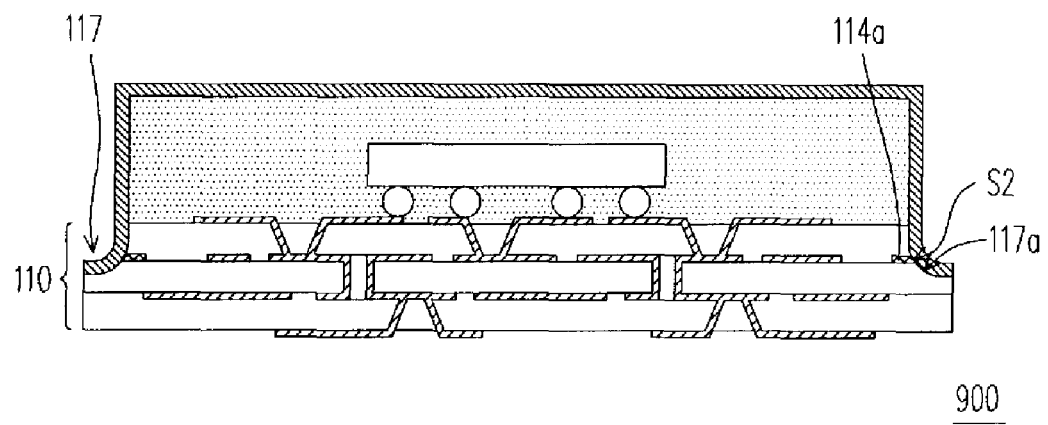
FIG. 9 is a cross-sectional view of a semiconductor device package structure according to another embodiment of the present invention.

FIG. 9 is a cross-sectional view of a semiconductor device package structure according to another embodiment of the present invention. Referring to FIG. 9, the package structure 900 is mostly similar to the package structure 500 of FIG. 5, except that a bottom 117a of the recessed portion 117 is curved, and the grounding ring 114a is exposed at or near the curved bottom 117a of the recessed portion 117. By configuring the recessed portion 117 of the circuit substrate 110 in a curved profile, the connection surface (i.e. the sidewall S2) of the grounding ring 114a is enlarged to enhance reliability and efficiency of electrical connections for reducing EMI.

In brief, an electrical connection between the conductive coating and the grounding ring within the circuit substrate is established by performing a half cutting process to reduce the thickness of the periphery of the circuit substrate, and thereby the conductive coating can be preferably connected to the grounding ring via a sidewall of the same. In the semiconductor package structures of embodiments of the present invention, the conductive coating conformally covers the encapsulant and the circuit substrate and functions as an EMI shielding layer, protecting the package structure from radiation from surrounding radiation sources. Hence, the conductive coating can be electrically connected to the ground plane or other reference plane of the circuit substrate. For example, an electrical ground path is established within the package structure for EMI shielding, devoid of using an extra ground plane. The substantially complete coverage of the conductive coating can effectively enhance the EMI shielding efficacy of the package structure. In addition, the peripheral portion of the circuit substrate may further be downwardly recessed to expose the sidewall of the grounding ring. The recessed portion of the circuit substrate can be formed in a curved profile to enlarge the connection surface of the grounding ring to enhance reliability and efficiency of electrical connections for EMI shielding. Moreover, such design is compatible with the packaging of high frequency devices, particularly radio frequency devices.

It will be apparent to those skilled in the art that various modifications and variations can be made to the structure of embodiments of the present invention without departing from the scope or spirit of the invention. In view of the foregoing, it is intended that the present invention covers modifications and variations of this invention that fall within the scope of the following claims and their equivalents.

What is claimed is:

1. A semiconductor package, comprising:
  a substrate including:
    a first grounding ring, wherein a portion of the first grounding ring is exposed at a lateral periphery of the substrate;
    a second grounding ring, wherein a portion of the second grounding ring is exposed at the lateral periphery of the substrate, and the first grounding ring overlies the second grounding ring; and
    a dielectric disposed between the first grounding ring and the second grounding ring;
  a die disposed adjacent to and electrically connected to the substrate;
  an encapsulant disposed adjacent to the substrate and encapsulating the die, the encapsulant having exterior surfaces; and
  a shield substantially covering the exterior surfaces of the encapsulant and connected to the exposed portion of the first grounding ring and the exposed portion of the second grounding ring to enhance reliability of electromagnetic interference shielding.

2. The semiconductor package of claim 1, wherein:
  a portion of the lateral periphery of the substrate is inwardly recessed to form a recessed part; and
  the portion of the first grounding ring and the portion of the second grounding ring are exposed at the recessed part.

3. The semiconductor package of claim 2, wherein:
  the substrate includes a third grounding ring including a portion exposed at a bottom of the recessed part; and
  the shield is connected to the exposed portion of the third grounding ring.

4. The semiconductor package of claim 1, wherein the first grounding ring and the second grounding ring are embedded in the substrate.

5. The semiconductor package of claim 1, wherein the encapsulant is disposed on the first grounding ring.

6. The semiconductor package of claim 1, wherein the exposed portions of the first grounding ring and the second grounding ring each circumscribe the substrate.

7. The semiconductor package of claim 1, wherein the shield contacts and substantially covers the exposed portions of the first grounding ring and the second grounding ring.

8. A semiconductor package, comprising:
  substrate including:
    an upper surface, a lower surface, and a side surface extending between the upper surface and the lower surface;
    a first conductive layer including a first internal grounding trace extending laterally to the side surface;
    a second conductive layer including a second internal grounding trace extending laterally to the side surface; and
    a dielectric separating the first conductive layer from the second conductive layer;
  a package body having a periphery, wherein a first portion of the periphery is disposed adjacent to the upper surface of the substrate and a second portion of the periphery faces away from the substrate; and
  an electromagnetic interference shield substantially covering the second portion of the periphery of the package body and the side surface of the substrate, wherein the electromagnetic interference shield contacts the first internal grounding trace and the second internal grounding trace at the side surface of the substrate to enhance reliability of electromagnetic interference shielding.

9. The semiconductor package of claim 8, wherein the first internal grounding trace and the second internal grounding trace each extend at least fifty percent around the substrate in corresponding planes substantially parallel to the upper surface of the substrate, and the first internal grounding trace overlies the second internal grounding trace.

10. The semiconductor package of claim 8, wherein the first internal grounding trace and the second internal grounding trace each circumscribe the substrate.

11. The semiconductor package of claim 8, wherein the electromagnetic interference shield substantially covers portions of the first internal grounding trace and the second internal grounding trace exposed at the side surface of the substrate.

12. The semiconductor device package of claim 8, wherein:
   a portion of the side surface of the substrate is inwardly recessed to form a recessed part; and
   the first internal grounding trace and the second internal grounding trace extend to the recessed part.

13. The semiconductor device package of claim 12, wherein the second internal grounding trace is exposed at a bottom of the recessed part.

14. A semiconductor package comprising:
   a substrate including:
      a first grounding layer extending around a border of the substrate, wherein a portion of the first grounding layer is exposed at a lateral periphery of the substrate;
      a second grounding layer extending around the border of the substrate, wherein a portion of the second grounding layer is exposed at the lateral periphery of the substrate, and the first grounding layer is disposed above the second grounding layer; and
      a dielectric disposed between the first grounding layer and the second grounding layer;
   a package body disposed adjacent to the substrate; and
   a conductive shield circumscribing the package body and covering the exposed portions of the first grounding layer and the second grounding layer to enhance reliability of electromagnetic interference shielding.

15. The semiconductor package of claim 14, wherein the first grounding layer and the second grounding layer each extend around the border of the substrate in a continuous pattern.

16. The semiconductor package of claim 14, wherein:
   a portion of the border of the substrate is inwardly recessed to form a recessed part; and
   the portion of the first grounding layer and the portion of the second grounding layer are exposed at the recessed part.

17. The semiconductor package of claim 16, wherein:
   the substrate includes a third grounding layer including a portion exposed at a bottom of the recessed part; and
   the conductive shield is connected to the exposed portion of the third grounding layer.

18. The semiconductor package of claim 16, wherein a bottom of the recessed part is curved.

19. The semiconductor package of claim 14, wherein the conductive shield contacts the exposed portions of the first grounding layer and the second grounding layer.

20. The semiconductor package of claim 14, wherein:
   the package body is disposed adjacent to an upper surface of the substrate; and
   the first grounding layer and the second grounding layer each extend at least fifty percent around the substrate in corresponding planes substantially parallel to the upper surface of the substrate.

* * * * *